(12) United States Patent
Iizuka

(10) Patent No.: US 7,232,502 B2
(45) Date of Patent: Jun. 19, 2007

(54) SHEET-FED TREATING DEVICE

(75) Inventor: Hachishiro Iizuka, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 235 days.

(21) Appl. No.: 10/250,907

(22) PCT Filed: Jan. 9, 2002

(86) PCT No.: PCT/JP02/00041

§ 371 (c)(1),
(2), (4) Date: Jul. 8, 2003

(87) PCT Pub. No.: WO02/056357

PCT Pub. Date: Jul. 18, 2002

(65) Prior Publication Data

US 2004/0035530 A1    Feb. 26, 2004

(30) Foreign Application Priority Data

Jan. 9, 2001    (JP) .............................. 2001-001152

(51) Int. Cl.
  *C23F 1/00*    (2006.01)
  *H01L 21/306*    (2006.01)
  *C23C 16/00*    (2006.01)
(52) U.S. Cl. ................. 156/345.51; 118/728
(58) Field of Classification Search ........... 156/345.51; 118/728
See application file for complete search history.

(56) References Cited

U.S. PATENT DOCUMENTS

| | | | |
|---|---|---|---|
| 2,433,922 A * | 1/1948 | Osterberg | ................ 174/17.05 |
| 4,649,859 A | 3/1987 | Wanlass | |
| 5,156,820 A * | 10/1992 | Wong et al. | ............ 422/186.05 |
| 5,256,205 A * | 10/1993 | Schmitt et al. | ..... 118/723 MW |
| 5,767,628 A * | 6/1998 | Keller et al. | ............ 315/111.51 |
| 5,948,704 A | 9/1999 | Benjamin et al. | |
| 5,993,557 A * | 11/1999 | Tomita et al. | .............. 118/730 |
| 6,402,848 B1 | 6/2002 | Horiguchi et al. | |
| 6,812,157 B1 | 11/2004 | Gadgil | |

FOREIGN PATENT DOCUMENTS

| | | |
|---|---|---|
| JP | 4-53126 | 2/1992 |
| JP | 5-267182 | 10/1993 |

(Continued)

OTHER PUBLICATIONS

International Preliminary Examination Report (PCT/IPEA/409) (translated) issued for PCT/JP02/00041.

(Continued)

*Primary Examiner*—Karla Moore
(74) *Attorney, Agent, or Firm*—Smith, Gambrell & Russell, LLP

(57) ABSTRACT

A processing unit of the invention is a single wafer processing unit including: a processing container that can be vacuumed; a stage arranged in the processing container, on which an object to be processed can be placed; a discharging pipe connected to a bottom part of the processing container and extending substantially downward linearly; a vacuum pump directly connected to the discharging pipe; and a stage-supporting pillar arranged to extend in a substantially central portion of the discharging pipe and in a direction of the discharging pipe, the stage-supporting pillar supporting the stage.

16 Claims, 5 Drawing Sheets

FOREIGN PATENT DOCUMENTS

| | | |
|---|---|---|
| JP | 052 167182 | 10/1993 |
| JP | 7-73997 | 3/1995 |
| JP | 9-326398 | 12/1997 |
| JP | 20003/06851 | 11/2000 |
| WO | WO 00/79019 | 6/2000 |

OTHER PUBLICATIONS

Notification of Transmittal of Copies of Translation of the International Preliminary Examination Report (Form PCT/IB/338) issued for PCT/JP02/00041.

* cited by examiner

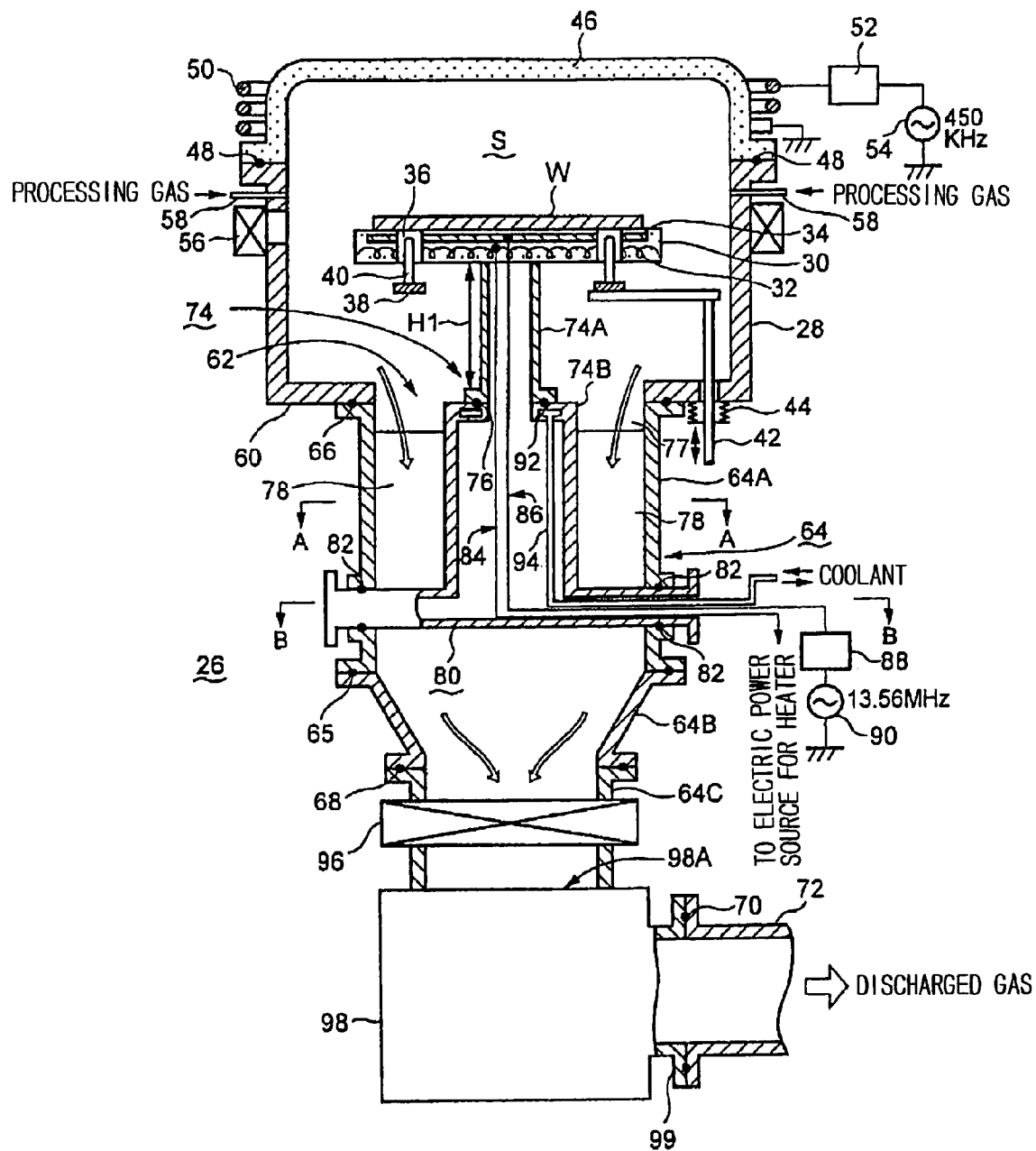
F I G. 1

SHEET-FED TREATING DEVICE

FIELD OF THE INVENTION

This invention relates to a single wafer processing unit that can carry out a process such as an etching process, a film-forming process or an annealing process, to semiconductor wafers or the like one by one.

BACKGROUND ART

In general, in order to manufacture a desired semiconductor integrated circuit, various processes including a film-forming process, an etching process, an oxidation-diffusion process, an annealing process or the like are carried out repeatedly to a substrate such as a semiconductor wafer. When the various processes are carried out, a necessary gas corresponding to a kind of the process, for example a film-forming gas for a film-forming process, ozone gas for an annealing process or an etching gas for an etching process (including a plasma etching process), is introduced into a processing container.

In the above case, the atmosphere in the processing container has been evacuated in order to maintain a pressure suitable for the kind of the process. It is requested that the evacuated gas flows uniformly with respect to the surface of the semiconductor wafer, in order to highly maintain uniformity of the process within the surface.

Herein, a conventional general processing unit for removing a natural oxidation film ($SiO_2$) or the like deposited on the surface of a semiconductor wafer by using plasma (for example, Japanese-Translated Patent Laid-Open Publication of PCT application No. 2000-511700) is explained. FIG. 7 is a schematic structural view of a conventional general processing unit of single-fed type. FIG. 8 is a plan view of a portion including the stage in FIG. 7.

As shown in FIG. 7, the processing unit using plasma has a processing container 2, for example having a cylindrical shape and made of aluminum. In the processing container 2, a stage 6 is arranged on a tip end of a hollow and wide supporting arm 4 that extends from a side wall of the container. A semiconductor wafer W is adapted to be placed on the stage 6. A large numbers of gas holes 7 that introduce a process gas, such as a plasma gas including Ar gas, $H_2$ gas and so on, into the processing container 2 are arranged at an upper portion of the sidewall of the processing container 2 in a circumferential direction thereof.

A ceiling part of the processing container 2 is open. A ceiling dome 8 having a cylindrical shape and a closed ceiling is hermetically arranged on the ceiling part. The ceiling dome 8 is made of for example quartz. An inductive coupling coil 10 is wound on an outside wall of the ceiling dome 8. A high-frequency wave of for example 450 kHz is adapted to be applied from a high-frequency electric power source 12 for inductively coupled plasma to the inductive coupling coil 10.

The stage 6 is made of for example ceramics such as aluminum nitride (AlN). A resistance heater 14 and a bias electrode 16 are buried (incorporated) in the stage 6. The resistance heater 14 is connected to an electric power source for heater. The bias electrode 16 is connected to a high-frequency electric power source 16 for biasing, which generates a high-frequency wave of for example 13.56 MHz.

A discharging pipe 18 with a large aperture is connected to a central portion of a bottom part of the processing container 2. The discharging pipe 18 extends downward and linearly by a predetermined length. A flow-way adjusting valve 20 and a vacuum pump 22 are provided in that order in the discharging pipe 18 in order to evacuate the processing container 2. The vacuum pump 22 consists of for example a turbo molecular pump. In addition, a flange at an outlet port of the vacuum pump 22 is connected to a discharging duct 24. Thus, the discharged gas is adapted to flow into a final gas abatement system (not shown).

SUMMARY OF THE INVENTION

In the above conventional unit, the process gas (plasma gas) is supplied substantially uniformly from the large number of gas holes 7 provided at the upper portion of the side wall of the processing container 2 into a processing space S in the processing container 2. Then, the process gas is made plasma by inductively coupling. The plasmatic gas (that has been made plasma) flows downward while etching the surface of the wafer, passes around the stage 6 and flows into the discharging pipe 18 (to be evacuated).

However, in the unit, the wide supporting arm 4 for supporting the stage 6 is mounted at the side wall of the processing container. Thus, the supporting arm 4 blocks and/or partializes the evacuated flow of the atmosphere in the processing container 2. That is, the flow of the discharged gas (the atmosphere in the processing container) is not uniform on and above the surface of the wafer. Therefore, the predetermined process, herein the etching process, is also not uniform within the wafer surface, so that the uniformity within the surface is deteriorated.

This invention is intended to solve the above problems. The object of this invention is to provide a single wafer processing unit which can improve uniformity within a surface of an object to be processed placed on a stage during various processes by substantially uniformly evacuating the atmosphere in a processing space through around the stage.

This invention is a single wafer processing unit comprising: a processing container that can be vacuumed; a stage arranged in the processing container, on which an object to be processed can be placed; a discharging pipe connected to a bottom part of the processing container and extending substantially downward linearly; a vacuum pump directly connected to the discharging pipe; and a stage-supporting pillar arranged to extend in a substantially central portion of the discharging pipe and in a direction of the discharging pipe, the stage-supporting pillar supporting the stage.

According to the present invention, the atmosphere in the processing container can be substantially uniformly evacuated and discharged through around the stage, without partialized. Thus, the gas flow on and above a surface of the object to be processed can be made uniform within the surface. Therefore, the uniformity of a process within the surface can be improved.

Preferably, the stage-supporting pillar is attached to the discharging pipe by means of an attachment plate that extends in the direction of the discharging pipe.

The attachment plate may be formed by a plate member thin enough that the plate member doesn't block the flow of discharged gas.

Preferably, a plurality of attachment plates is arranged spokewise around and from the stage-supporting pillar.

In addition, the stage-supporting pillar may have a hollow pipe member that extends in the direction of the discharging pipe.

An electric-power supplying line may be arranged in the hollow pipe member.

A lower part of the hollow pipe member may be connected to a line-taking-off pipe that extends through a side wall of the discharging pipe.

Preferably, the stage-supporting pillar may be attached to the discharging pipe by means of the line-taking-off pipe. In the case, more preferably, the stage-supporting pillar is also attached to the discharging pipe by means of an attachment plate that extends in the direction of the discharging pipe. Further preferably, at least a part of the discharging pipe, at least a part of the hollow pipe member, the attachment plate and the line-taking-off pipe are integratedly formed.

In addition, for example, the discharging pipe has a circular section, and the line-taking-off pipe extends in a diametral direction of the discharging pipe, through two diametrally-opposite portions of a side wall of the discharging pipe, from a lower part of the hollow pipe member.

Alternatively, the discharging pipe has a circular section, and the line-taking-off pipe extends in a radial direction of the discharging pipe, through one portion of a side wall of the discharging pipe, from a lower part of the hollow pipe member.

Alternatively, the line-taking-off pipe extends through two portions of a side wall of the discharging pipe, from a lower part of the hollow pipe member, and the electric-power supplying line is separated into a first line that extends through one portion of the side wall and a second line that extends through the other portion of the side wall.

In the case, for example, the first line is an electric-power supplying line through which a high-frequency electric current flows, and the second line is an electric-power supplying line through which no high-frequency electric current flows.

Preferably, a coolant circulating way may be formed in parallel with the first and second lines.

In addition, preferably, a flow-way adjusting valve that controls a flow-way area of the discharging pipe is arranged on an upstream side of the vacuum pump.

In addition, preferably, a high-frequency coil connected to a high-frequency electric power source for inductively coupled plasma is arranged at a ceiling part of the processing container, and a bias electrode connected to a high-frequency electric power source for biasing is provided in the stage.

BRIEF DESCRIPTION OF THE DRAWINGS

FIG. 1 is a structural view showing an embodiment of a single wafer processing unit according to the present invention;

DESCRIPTION OF THE PREFERRED EMBODIMENT

Hereinafter, an embodiment of a single wafer processing unit according to the present invention is explained with reference to attached drawings.

Figure 2:
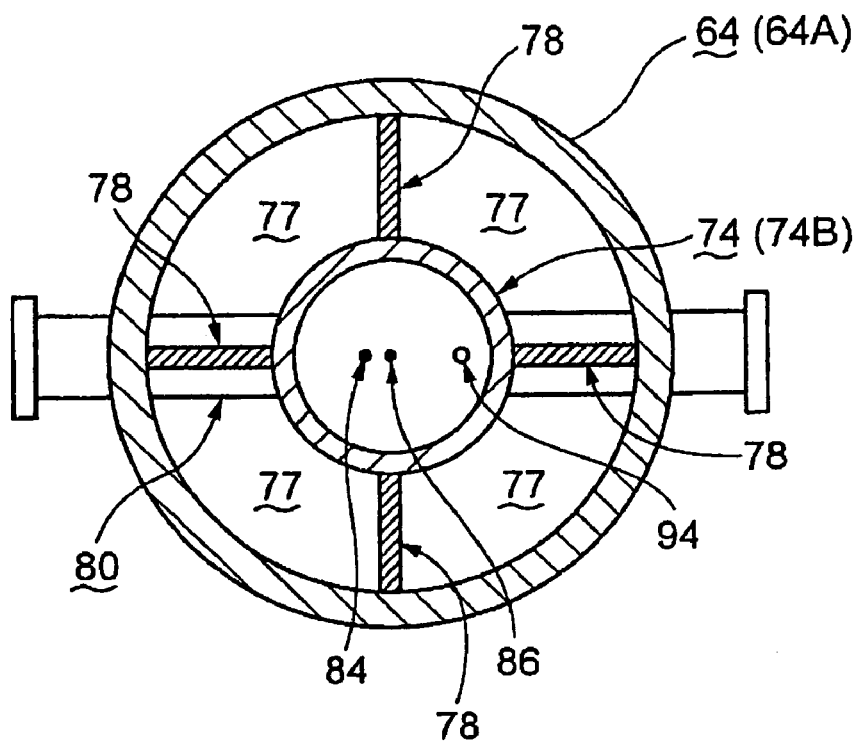
FIG. 2 is a sectional view taken along A—A line of FIG. 1.
Figure 3:
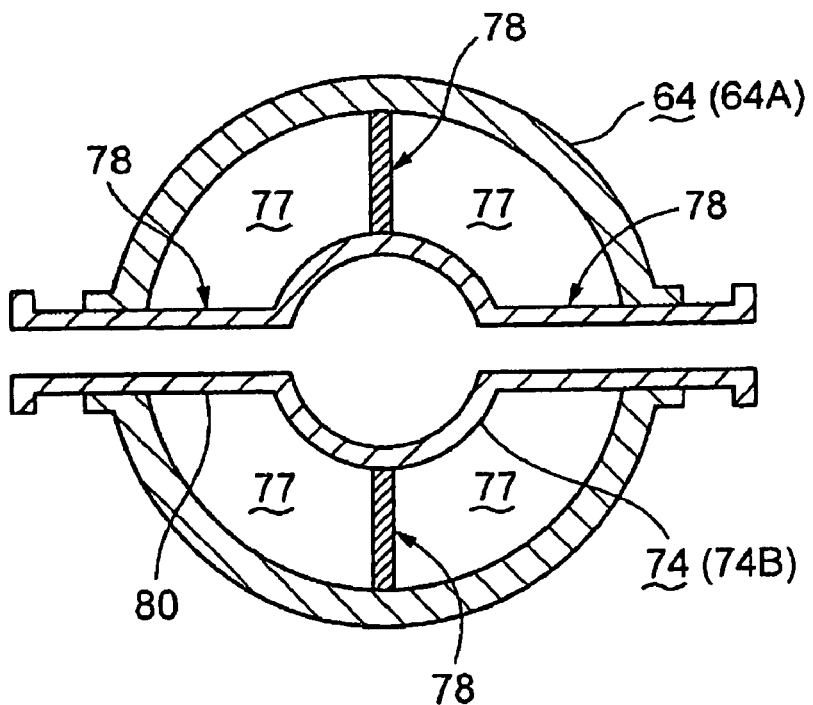
FIG. 3 is a sectional view taken along B—B line of FIG. 1.

FIG. 1 is a structural view showing the embodiment of a single wafer processing unit of the present invention. FIG. 2 is a sectional view taken along A—A line of FIG. 1. FIG. 3 is a sectional view taken along B—B line of FIG. 1.

The processing unit of the embodiment is formed as a processing unit for etching a natural oxidation film by using inductively coupled plasma (ICP).

As shown in FIGS. 1 to 3, the processing unit 26 has a processing container 28 made of aluminum, which has for example a cylindrical shape and an open ceiling part. A disk-like stage 30, on which a semiconductor wafer W as an object to be processed is placed, is arranged at a central portion of the processing container 28. The stage 30 is made of for example ceramics such as aluminum nitride (AlN). If necessary, a resistance heater 32 as heating means and/or a bias electrode 34 for applying a high-frequency voltage has been previously buried in the stage 30.

A plurality of, for example three, pin holes 36 are formed vertically through the stage 30 (only two are shown in FIG. 1). A lifting pin 40 is freely contained in each pin hole 36. A linking ring 38 commonly links respective lower ends of the lifting pins 40. The lifting pin 40 is made of for example ceramics. The linking ring 38 is supported and can be vertically moved by a lifting rod 42, which penetrates a bottom part of the processing unit 28 and can be vertically moved. If the linking ring 38 i.e. the lifting pins 40 are vertically moved, the wafer W can be also lifted up and down.

A bellows 44 made of metal is arranged at a portion penetrated by the lifting rod 42 in the bottom part of the processing container. Thus, airtightness in the processing container 28 can be maintained while the lifting rod 42 can be vertically moved.

In addition, above a peripheral portion of the stage 30, a shadow ring for protecting a peripheral portion of the wafer and a peripheral portion of the stage from an etching process during the etching process can be provided in such a manner that it can be vertically moved, but not shown.

A ceiling dome 46 that has a short cylindrical shape and a closed ceiling end is hermetically arranged on the open ceiling part of the processing container 28 via a sealing member 48 such as an O-ring. The ceiling dome 46 is made of for example quartz. A high-frequency coil 50 for inductively coupled plasma is wound around the ceiling dome 46 by ten and several turns. The high-frequency coil 50 is connected to a high-frequency electric power source 54 for inductively coupled plasma of for example 450 kHz via a matching circuit 52.

A gate valve 56, which can be opened and closed when the wafer W is loaded or unloaded, is provided at an upper portion of a side wall of the processing container 28. A large number of, for example twenty, gas-ejecting holes 58 are formed at another upper portion of the side wall of the processing container 28 in a circumferential direction thereof as gas-supplying means. A process gas such as a plasma gas, whose flow rate has been controlled, can be supplied into the processing container 28 through the gas-ejecting holes 58.

An opening 62 with a large aperture, whose diameter is about 210 mm, is formed at a substantially central portion of the bottom part 60 of the processing container 28, while the inside diameter of the processing container 28 is about 362 mm. A discharging pipe 64 with a similar large aperture is hermetically connected to the opening 62 via a sealing member 66 such as an O-ring so that it extends downward (vertically) and substantially linearly. Thus, the discharging-conductance is as large as possible.

More concretely, the discharging pipe 64 mainly consists of: an upper pipe 64A connected to the bottom part 60, a lower pipe 64C whose diameter is small, and a pipe-diameter adjusting pipe 64B whose diameter is gradually reduced to adjust a pipe diameter thereof from a lower end of the upper pipe 64A to an upper end of the lower pipe 64C. Sealing members 65, 68 such as O-rings are provided at connecting portions between the respective pipes 64A to 64C to maintain airtightness therebetween. A vacuum pump 98 is connected to a lower end of the lower pipe 64C. Another discharging pipe 72 is connected to a gas-discharging flange 99 provided at a side portion of the vacuum pump 98, via a sealing member 70 such as an O-ring.

A stage-supporting pillar 74 for supporting the stage 30 is arranged in a substantially central portion in the upper pipe 64A of the discharging pipe 64 coaxially therewith. The stage-supporting pillar 74 is made of for example aluminum. More concretely, the stage-supporting pillar 74 consists of an upper hollow pipe member 74A and a lower hollow pipe member 74B that is hermetically connected to a lower end portion of the upper hollow pipe member 74A via a sealing member 76 such as an O-ring. An upper end of the upper hollow pipe member 74A is hermetically connected to a lower surface of the stage 30 and is adapted to support the stage 30.

The lower hollow pipe member 74B and the upper pipe 64A form a kind of double-tube structure. The discharged gas is adapted to flow through a doughnut space 77 (see FIG. 2) between their members. A plurality of, four in the shown example, spokewise attachment plates 78 (see FIG. 2) are arranged at substantially the same interval in a circumferential direction in order to connect an outside wall of the lower hollow pipe member 74B and an inside wall of the upper pipe 64A. The attachment plates 78 are adapted to bear loads of the stage 30 and the stage-supporting pillar 74. In addition, in the case, the space 77 is divided into four partial spaces by the attachment plates 78.

In addition, the attachment plates 78 are provided along a flow direction of the discharged gas i.e. along a vertical direction. Thus, the gas-discharging (exhausting) resistance can be reduced as much as possible. The number of attachment plates 78 is not limited to four. The number of attachment plate 78 may be reduced to two or three in order to reduce the gas-discharging resistance more.

A hollow line-taking-off pipe 80, which laterally penetrates the upper pipe 64A and crosses the space 77 orthogonally to the gas flow, is connected to the lower end of the lower hollow pipe member 74B of the stage-supporting pillar 74 in such a manner that they communicate with each other. The line-taking-off pipe 80 is also adapted to bear the loads of the stage 30 and the stage-supporting pillar 74. The lower ends of the attachment plates 78 are connected to upper-end portions of an outside wall of the line-taking-off pipe 80. If the strength of the line-taking-off pipe 80 is set to be high enough to bear the loads, it is possible to omit attaching the attachment plates 78.

A sealing member 82 such as an O-ring is provided at a portion of the upper pipe 64A penetrated by the line-taking-off pipe 80. Thus, airtightness in the discharging pipe 64 can be maintained. On the other hand, the inside of the line-taking-off pipe 80 and the inside of the stage-supporting pillar 74 communicate with outside atmosphere to be under the atmospheric pressure. A heater cable 84 that is connected to the resistance heater 32 and a high-frequency cable 86 that is connected to the bias electrode 34 are inserted in the line-taking-off pipe 80, as electric power supplying lines. The other end of the heater cable 84 is connected to an electric power source for heater (not shown). The other end of the high-frequency cable 86 is connected to a high-frequency electric power source 90 for biasing that outputs a high frequency voltage for biasing of for example 13.56 MHz, via a matching circuit 88.

A cooling jacket 92 is provided at a connecting portion between the upper hollow pipe member 74A and the lower hollow pipe member 74B of the stage-supporting pillar 74, in order to prevent thermal damage of the sealing member 76 provided at the portion. A coolant circulating way 94 for causing a coolant to flow into the cooling jacket 92 is inserted in the stage-supporting pillar 74 and in the line-taking-off pipe 80.

A flow-way adjusting valve 96 consisting of a three-position gate valve is provided in the lower pipe 64C of the discharging pipe 64. The flow-way adjusting valve 96 can adjust a flow-way area at three stages from a full-open state of the discharging pipe 64 to a full-closed state thereof. A throttle valve or the like, which can continuously adjust the flow-way area, can be used as the flow-way adjusting valve 96 instead of the above gate valve.

A vacuum pump 98 consisting of for example a turbo-molecular pump or the like is directly connected to the lower pipe 64C just below the flow-way adjusting valve 96. In the case, an inlet port 98A of the vacuum pump 98 is arranged orthogonally to the flow of the discharged gas. Thus, the gas-discharging resistance is reduced as much as possible.

The length H1 of the upper hollow pipe member 74A is set to be for example about 159 mm, in order to obtain temperature gradient enough that the sealing member 76 under a cooled state thereof is not thermally deteriorated.

Herein, in the above embodiment, the upper pipe 64A, the pipe-diameter adjusting pipe 64B, the attachment plates 78, the line-taking-off pipe 80 and the lower hollow pipe member 74B are respectively provided as separate members. However, these members may be formed integratedly, for example by cutting out an aluminum block. According to the latter, it is possible to enhance credibility of sealing characteristic and mechanical strength.

Next, an operation of the above embodiment is explained.

At first, an unprocessed semiconductor wafer W held by a conveying arm not shown is loaded into the processing container 28 through the opened gate valve 56. The wafer is transferred onto the lifting pins 40. Then, the lifting pins 40 are moved downward, so that the wafer W is placed onto the stage 30.

The stage 30 has been previously heated to a predetermined temperature, preliminary. After the wafer W is placed on the stage 30, electric power supplied to the resistance heater 32 is increased, so that the wafer W is heated to a predetermined process temperature, for example 600° C., and the process temperature is maintained.

Then, the process gas whose flow rate has been controlled, such as Ar gas and/or $H_2$ gas as a plasma gas, is supplied into the processing container 28 from the respective gas-ejecting holes 58 provided at the upper portion of the side wall of the processing container 28. At the same time, the processing container 28 is vacuumed by the vacuum pump 98, so that the inside of the processing container 28 is maintained at a predetermined pressure, for example of about 5 mTorr (0.7 pa) to 5 Torr (665 pa). In addition, at the same time, the high-frequency electric power for biasing of 13.56 MHz is applied to the bias electrode 34 buried in the stage 30. On the other hand, the high-frequency electric power of 450 kHz is applied to the high-frequency coil 50 wound around the ceiling dome 46. Thus, inductive coupling is generated, and plasma is generated in the processing space S. That is, activated species of argon gas and/or hydrogen are generated, and a natural oxidation film or the like on the surface of the wafer on the stage 30 is etched.

Figure 7:
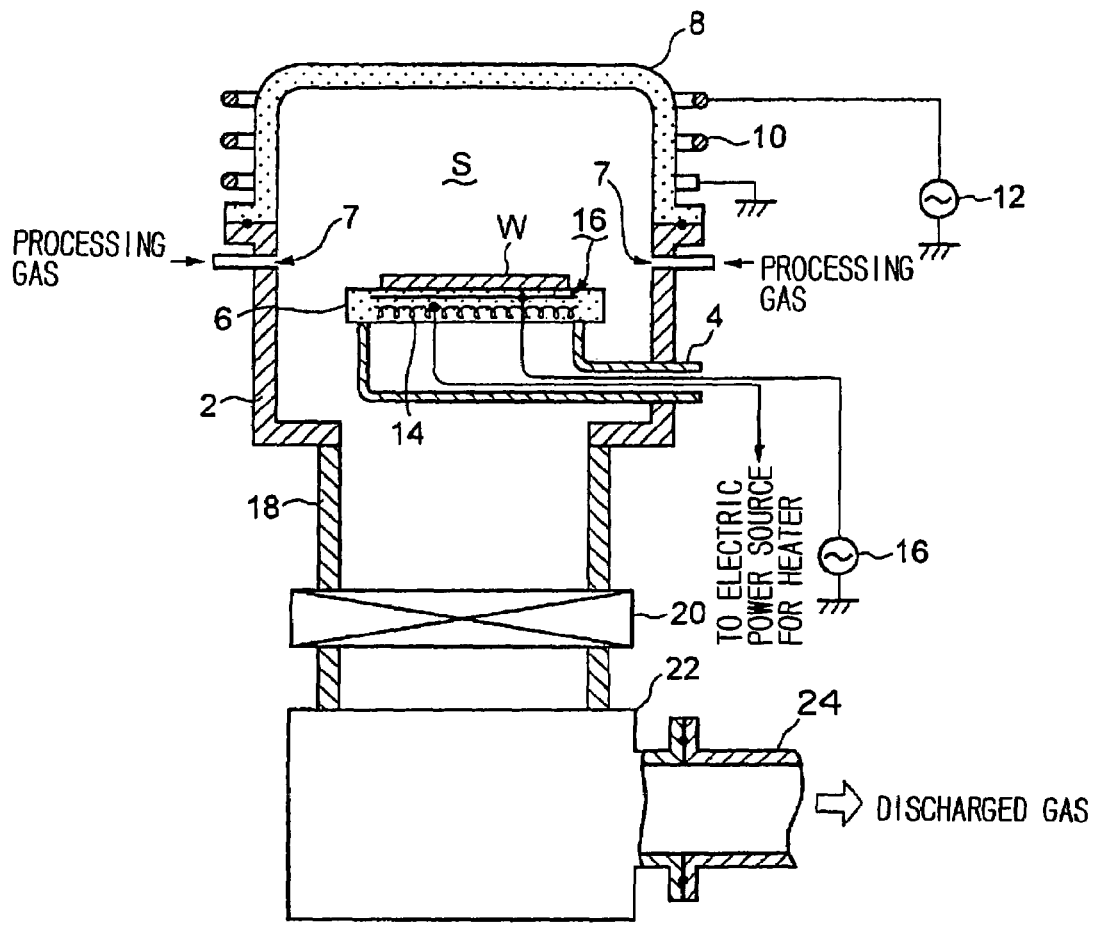
FIG. 7 is a schematic structural view showing a conventional general single wafer processing unit.
Figure 8:
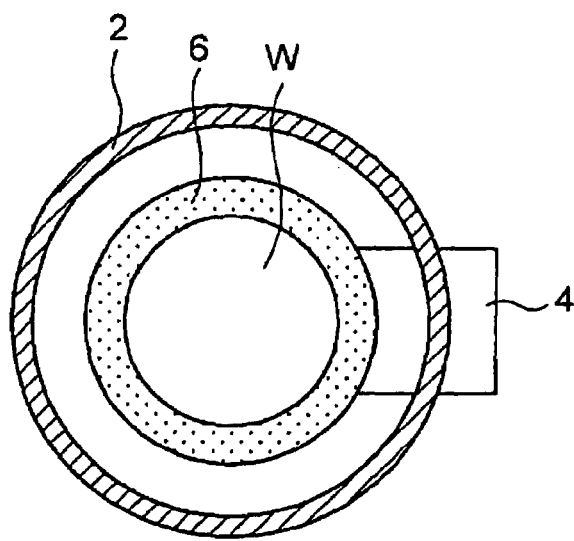
FIG. 8 is a plan view showing a portion including the stage in FIG. 7.

In the embodiment, the process gas introduced from the respective gas-ejecting holes 58 into the processing container 28 is made plasma, and hence becomes activated species, and is evacuated to flow outside of the stage 30 and vertically through the discharging pipe 64. Herein, differently from the conventional unit shown in FIG. 7, the stage 30 is supported by the stage-supporting pillar 74 that extends in the vertical direction and coaxially in the discharging pipe 64. Thus, substantially, there is no member that blocks the flow of the discharged gas in the processing container 28. Therefore, the discharged gas can be evacuated substantially uniformly around the stage 30 without partialized. As a result, the gas flow on and above the wafer surface can be made uniform, plasma density can be also made uniform within the surface, and hence uniformity of the plasma process within the surface can be remarkably enhanced.

In addition, the attachment plates 78 that fix the stage-supporting pillar 74 to the discharging pipe 64 are very thin, and moreover they are arranged along the direction of the discharged gas flow. Thus, they hardly become any gas-discharging resistance. That is, high gas-discharging conductance can be maintained. The attachment plates 78 are made of for example aluminum.

In addition, similarly, since the vacuum pump 98 is directly attached to the lower pipe 64C of the discharging pipe 64 that extends in a substantially vertical direction and linearly from the bottom part of the processing container 28, the atmospheric gas in the processing container 28 can be smoothly evacuated. Thus, higher gas-discharging conductance can be maintained.

The position where the line-take-off pipe 80 crossing the inside of the discharging pipe 64 is attached is located much lower than the bottom part 60 of the processing container 28. Thus, it is seldom that the line-take-off pipe 80 disturbs the flow of the atmospheric gas in the processing container 28 and/or becomes a large gas-discharging resistance.

In addition, the length of the stage-supporting pillar 74 supporting the stage 30 is set to be enough long, and thus the temperature gradient of the stage-supporting pillar 74 is small enough that the temperature gradient doesn't badly affect temperature distribution of the stage 30. Thus, temperature distribution of the wafer is not affected badly.

In the above embodiment, the line-take-off pipe 80 for taking off the electric power supplying lines such as the heater cable 84 and the high-frequency cable 86 is provided to diametrically cross the section of the upper pipe 64A that is a flow way. However, this invention is not limited to that manner. The line-take-off pipe 80 may be provided only at a radial portion of the upper pipe 64A.

Figure 4:
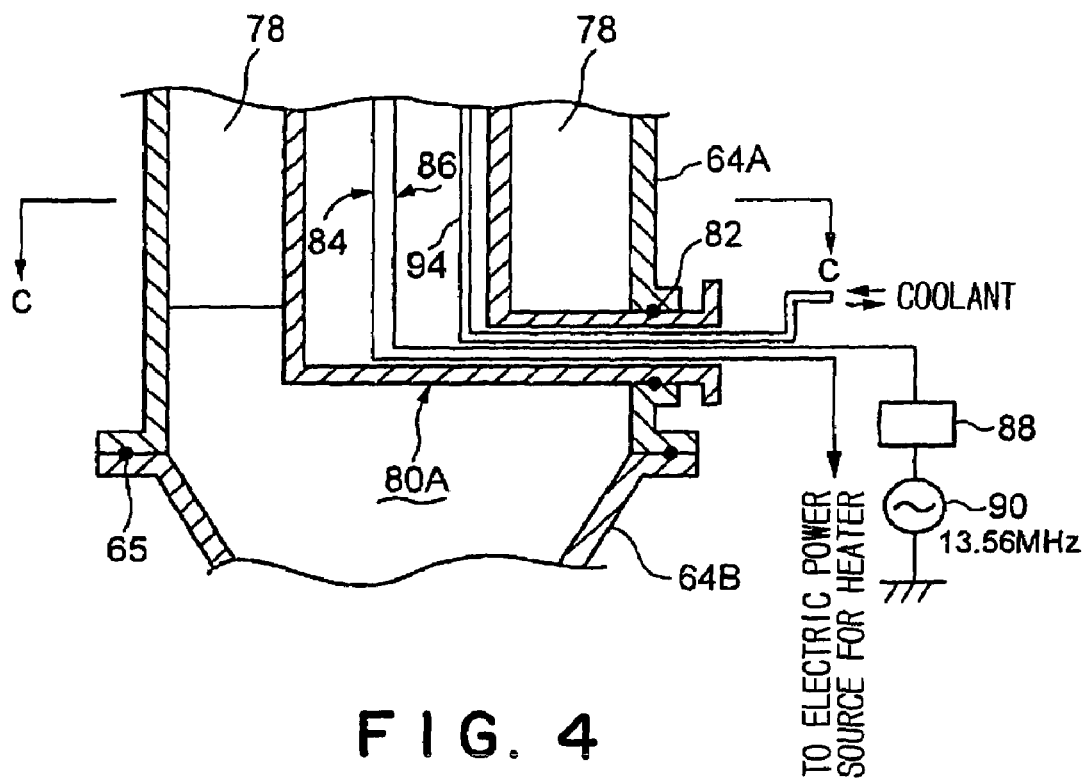
FIG. 4 is a partial sectional view showing a part of another embodiment of a processing unit according to the present invention.
Figure 5:
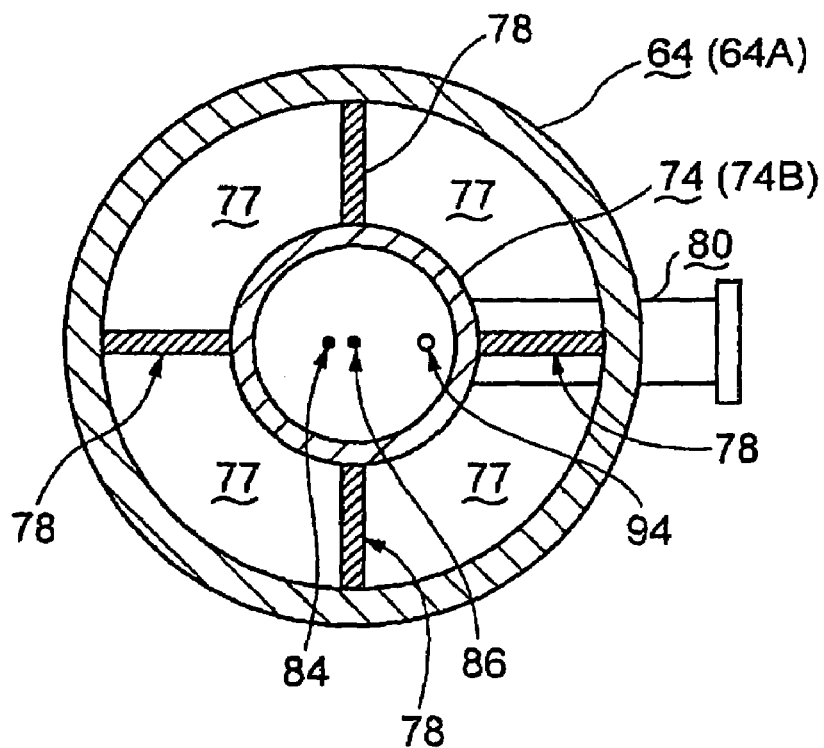
FIG. 5 is a sectional view taken along C—C line of FIG. 4.

FIG. 4 is a partial sectional view showing a part of an embodiment of such a unit according to the present invention. FIG. 5 is a sectional view taken along C—C line of FIG. 4. In the embodiment, other portions not shown in FIG. 4 are the same as the structure shown in FIG. 1. As shown in FIGS. 4 and 5, in the embodiment, the line-taking-off pipe 80A is connected to the lower end of the lower hollow pipe member 74B of the stage-supporting pillar 74 and extends in a radial direction thereof to penetrate one portion of the side wall of the discharging pipe 64. Thus, the stage-supporting pillar 74 is cantilevered.

Compared with the structure of the line-take-off pipe 80 shown in FIG. 1, in the case of the line-take-off pipe 80A shown in FIGS. 4 and 5, the gas-discharging resistance is smaller by that an attachment of another line-take-off pipe in a radial direction opposite to the line-take-off pipe 80A is omitted, that is, the discharged gas can be evacuated more smoothly.

Of course, if the discharging pipe 64 has two penetrated portions, like the case of the line-take-off pipe 80 shown in FIG. 1, for example, a high-frequency electric power system (high-frequency cable 86) and the other electric power systems (heater cable 84) may be separately formed. The coolant circulating way 94 may be formed for each electric power system.

In the above embodiments, the etching unit by means of inductively coupled plasma is explained. However, this invention is not limited thereto. This invention is applicable to any other type of etching unit. For example, this invention is applicable to a parallel-plate type of processing unit or the like.

Furthermore, this invention is not limited to the etching unit, but also applicable to a CVD film-forming unit, an oxidation-diffusion unit, an ashing unit, a modification unit, or the like. In addition, the heating means is not limited to the resistance heater, but could be a heating lamp.

Figure 6:
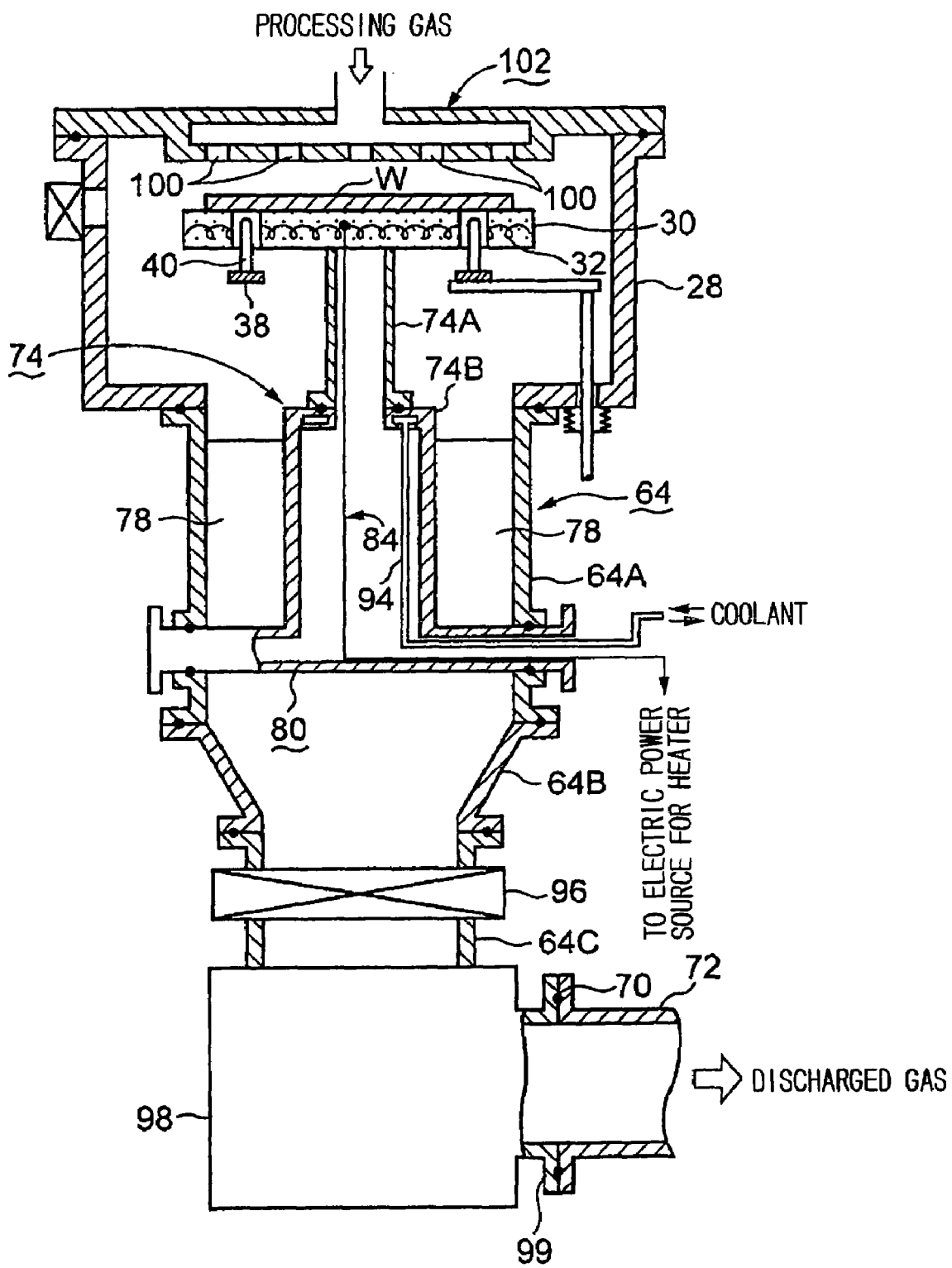
FIG. 6 is a structural view showing another embodiment of a processing unit according to the present invention.

For example, FIG. 6 is a schematic structural view of a processing unit for a thermal CVD film-forming process as another embodiment of a processing unit according to the present invention. The same parts as shown in FIG. 1 are designated by the same numeral signs, and explanation thereof is omitted.

In the embodiment, a showerhead 102 having a lot of gas-ejecting holes 100 as gas-supplying means is arranged at the ceiling part of the processing container 28, instead of the ceiling dome 46 and the high-frequency coil 50. Thus, a thermal CVD process can be carried out. Thus, in the embodiment, the gas-ejecting holes 58, the bias electrode 34, the high-frequency electric power source for biasing 90 and so on, shown in FIG. 1, are omitted.

According to the embodiment, the gas flow on and above the wafer surface can be made uniform without partialized. Thus, the process can be carried out more uniformly, that is, uniformity of film-thickness within the surface can be enhanced.

In addition, in the above embodiments, the semiconductor wafer is explained as an object to be processed. However, this invention is not limited thereto, but also applicable to a LCD substrate, a glass substrate and so on.

The invention claimed is:

1. A single wafer processing unit comprising:
  a processing container that can be vacuumed,
  a stage arranged in the processing container, on which an object to be processed can be placed,
  a discharging pipe connected to a bottom part of the processing container and extending substantially downward linearly,
  a stage-supporting pillar arranged to extend in a substantially central portion of the discharging pipe and in a direction of the discharging pipe, the stage-supporting pillar supporting the stage, and
  a line-taking-off pipe extending through a side wall of the discharging pipe and connected to a lower-end part of the stage-supporting pillar, wherein an inside of the line-taking-off pipe is communicated with an inside of the stage-supporting pillar and wherein the inside of the line-taking-off pipe and the inside of the stage-supporting pillar communicate with the outside atmosphere to be under atmospheric pressure.

2. A single wafer processing unit according to claim 1, wherein the stage-supporting pillar is attached to the discharging pipe by means of an attachment plate that extends in the direction of the discharging pipe.

3. A single wafer processing unit according to claim 2, wherein the attachment plate is attached on an upper-end portion of an outside wall of the line-taking-off pipe.

4. A single wafer processing unit according to claim 2, wherein a plurality of attachment plates is arranged spokewise around and from the stage-supporting pillar.

5. A single wafer processing unit according to claim 1, wherein the stage-supporting pillar has a hollow pipe member that extends in the direction of the discharging pipe.

6. A single wafer processing unit according to claim 5, wherein an electric-power supplying line is arranged in the hollow pipe member.

7. A single wafer processing unit according to claim 1, wherein the inside of the line-taking-off pipe communicates with the atmosphere under atmospheric pressure.

8. A single wafer processing unit according to claim 1, wherein the stage-supporting pillar is attached to the discharging pipe by means of the line-taking-off pipe.

9. A single wafer processing unit according to claim 8, wherein the stage-supporting pillar is also attached to the discharging pipe by means of an attachment plate that extends in the direction of the discharging pipe, and at least a part of the discharging pipe, at least a part of the hollow pipe member, the attachment plate and the line-taking-off pipe are integratedly formed.

10. A single wafer processing unit according to claim 1, wherein the discharging pipe has a circular section, and the line-taking-off pipe extends in a diametral direction of the discharging pipe, through two diametrally-opposite portions of a side wall of the discharging pipe, from a lower part of the hollow pipe member.

11. A single wafer processing unit according to claim 1, wherein the discharging pipe has a circular section, and the line-taking-off pipe extends in a radial direction of the discharging pipe, through one portion of aside wall of the discharging pipe, from a lower part of the hollow pipe member.

12. A single wafer processing unit according to claim 6, wherein the line-taking-off pipe extends through two portions of a side wall of the discharging pipe, from a lower part of the hollow pipe member, and the electric-power supplying line is separated into a first line that extends through one portion of the side wall and a second line that extends through the other portion of the side wall.

13. A single wafer processing unit according to claim 12, wherein the first line is an electric-power supplying line through which a high-frequency electric current flows, and the second line is an electric-power supplying line through which no high-frequency electric current flows.

14. A single wafer processing unit according to claim 12, wherein a coolant circulating way is formed in parallel with the first and second lines.

15. A single wafer processing unit according to claim 1, wherein a flow-way adjusting valve that controls a flow-way area of the discharging pipe is arranged on an upstream side of the vacuum pump.

16. A single wafer processing unit according to claim 1, wherein a high-frequency coil connected to a high-frequency electric power source for inductively coupled plasma is arranged at a ceiling part of the processing container, and a bias electrode connected to a high-frequency electric power source for biasing is provided in the stage.

* * * * *